United States Patent [19]
Coburn et al.

[11] Patent Number: 5,109,166
[45] Date of Patent: Apr. 28, 1992

[54] SINUSOIDAL SIGNAL GENERATOR

[75] Inventors: Ronald L. Coburn, Fuquay-Varina; Charles R. Hoffman, Raleigh, both of N.C.; Philip H. Sutterlin, San Jose, Calif.

[73] Assignee: International Business Machines Corporation, Armonk, N.Y.

[21] Appl. No.: 516,418

[22] Filed: Apr. 30, 1990

[51] Int. Cl.⁵ .................... H03K 17/16; H03K 19/092
[52] U.S. Cl. .................... 307/451; 307/263; 307/592; 307/594; 307/601
[58] Field of Search ............ 307/443, 448, 451, 263, 307/592, 594, 601, 270

[56] References Cited

U.S. PATENT DOCUMENTS

| | | | |
|---|---|---|---|
| 4,855,623 | 8/1989 | Flaherty | 307/451 |
| 4,857,863 | 8/1989 | Ganger et al. | 307/263 |
| 4,908,528 | 3/1990 | Huang | 307/451 |
| 4,959,563 | 9/1990 | Schenck | 307/451 |
| 4,992,676 | 2/1991 | Gerosa et al. | 307/263 |
| 5,010,256 | 4/1991 | Dicke | 307/263 |

Primary Examiner—Stanley D. Miller
Assistant Examiner—Margaret Rose Wambach
Attorney, Agent, or Firm—Joscelyn G. Cockburn

[57] ABSTRACT

A high current CMOS circuit including a raised cosine signal generator for generating a raised cosine signal waveform and an input circuit arrangement for controlling the raised cosine signal generator is described. The raised cosine signal generator includes an output node to which a controlled chain of CMOS inverters are connected. The input circuit arrangement accepts an input signal, converts it into appropriate signals which drive respective inverters so that simultaneous conduction of inverter pairs is prevented. The off chip driver (OCD) minimizes ground bounce, electrical noise and radiation problems caused by large current transients or spikes (di/dt) that usually accompany such circuits.

18 Claims, 5 Drawing Sheets

SINUSOIDAL SIGNAL GENERATOR

BACKGROUND OF THE INVENTION

1. Field of the Invention

The present invention relates to VLSI chips in general and more particularly to CMOS driver circuits used in said chips.

2. Background of the Invention

CMOS circuits or components have become the preferred building blocks for fabricating VLSI chips. CMOS VLSI chips are preferred because the circuits are low powered and relatively fast. Among the various CMOS building blocks is the output circuit which is referred to as an off-chip driver (OCD). The OCDs are used for driving circuits on other chips or high capacitances loaded internal net on the same VLSI chip.

A conventional CMOS OCD circuit has a pair of series connected P-channel and N-channel devices. Each device has a gate (G) electrode, a source (S) electrode and a drain (D) electrode. The devices are connected so that the gate electrodes are connected to an input node. the source electrode of the P-channel device is connected to a positive rail of a power supply. The source electrode of the N-channel device is connected to a negative rail of the power supply. The drain electrodes of the devices are connected to an output node. If an input voltage is applied to the input node, when the voltage is at ground potential, the P-channel device is turned on, the N-channel device is turned off and the output node is at the positive power supply voltage level.

Likewise, when the input voltage reaches the positive power supply voltage level, the P-channel device is turned off. The N-channel device is turned on and the output node swings to the negative power supply voltage level. As the input voltage swings between ground and a positive value (say Vcc), the P-channel and N-channel devices conduct simultaneously to cause a large current spike (di/dt). The large di/dt current causes noise in the system.

The rapid switching of the output devices between ground potential and Vcc is another source of noise in CMOS driver circuits. As the output changes states, the device draws a relatively large amount of current. The changing current (di/dt) excites the inductance between the chip and the board causing the chip's ground to rise, or "bounce". Inductance of the package pins can cause transient variations in the ground and voltage potentials seen by the chip circuits as higher current off chip driver circuits switch on and off. These drivers cause large di/dt values as they charge and discharge the capacitance seen at the output pins.

The electrical noise that is caused by the above described phenomenon causes a variety of problems. One of the obvious problems is radiation which has to be minimized to meet FCC EMI standards. Other problems include false detection of signal transitions due to ground bounce, input signal level-shift, etc. A more detailed description of ground bounce and related problems are set forth in an article entitled "EDN's Advance CMOS Logic GroundBound Tests," by David Shear, EDN Mar. 2, 1989, (p. 88).

The prior art sets forth several techniques for controlling the large di/dt current caused by simultaneous conduction of series connected FETs. Even though the prior art circuits differ in details, the general approach is to provide circuit arrangements that control the simultaneous conduction of the series connected FETs. Examples of the prior art techniques are set forth in U.S. Pat. Nos. 4,818,901, 4,806,802, 4,806,794, 4,800,298, 4,761,572, 4,758,743, 4,638,187, 4,274,014, 3,651,340, 3,631,528 and JP60-141020. Even though the prior art circuits work well for its intended purpose, the circuits tend to be complicated and difficult to implement with CMOS technology. Even if the circuits' implementations are relatively easy, they usually require unnecessary amount of surface area which is usually a scarce commodity in LSI chip design.

Another source of electrical noise in LSI circuit design is caused by interconnecting module leads of circuit boards. These strip lines exhibit behavior analogous to transmission lines. U.S. Pat. No. 4,749,882 discloses a device implemented in CMOS technology, for controlling this type of noise. The device consists of an input inverter circuit stage that controls the slope of an output signal from the inverter stage produced in response to an input signal.

U.S. Pat. No. 4,567,378 describes a driver circuit with a feedback loop that controls the output device so that the rise and fall times of the output signal matches that of an input signal.

IBM Technical Disclosure Bulletin, Vol. 27, No. 12, May, 1985 at page 7247 by C. K. Erdelyi, describes a driver circuit topology wherein cascaded pairs of devices sequence an input signal to an output node. An independent resistor (R) is connected to the control gate of each device.

An article by E. H. Stoops, IBM Technical Disclosure Bulletin, Vol. 27, No. 1A, June, 1984 (page 13), describes a circuit that controls the time rate of change of current in the active device in the output stage of an FET off-chip driver.

An article entitled "Raised Cosine Driver/Transmitter," in Research Disclosure, March, 1988, No. 287 describes a circuit in which a signal waveform is generated by switching independent current sources between two reference voltage levels.

SUMMARY OF THE PRESENT INVENTION

It is a general object of the present invention to provide a more efficient off-chip driver circuit than has heretofore been possible.

It is a more specific objective to provide an OCD that is easily fabricated by a CMOS process.

It is still another object to provide an OCD in which ground bounce and radiation problems are substantially less than has heretofore been possible.

The above and other objects are achieved by a circuit arrangement that uses non-simultaneous conductive CMOS pair devices to generate a sinusoidal signal waveform. The non-simultaneous conductive function is provided by a control circuit that forces devices to turn off more rapidly than they are turned on. The sinusoidal signal waveform is provided by sequentially actuating an arbitrary number of cascade FET devices whose width-to-length ratio (W/L) are weighted to generate a raised cosine signal waveform.

In particular, the OCD includes an input node $V_{IN}$ and an output node $V_{OUT}$. A plurality of inverters are coupled between the input and output nodes. Each inverter is formed from a pair of series connected devices. The gate electrodes of the series connected devices are coupled to a string of transfer gates which propagate an input signal presented at $V_{IN}$ so that the inverters are switched to an on state sequentially. The input signal is inverted and drives a controller which turns off devices in the inverters more rapidly than they are turned on.

In one embodiment of the present invention, the controller includes a plurality of series connected device pairs.

The foregoing features and advantages of the invention will be more fully described in the accompanying drawings.

DETAILED DESCRIPTION

Figure 1:
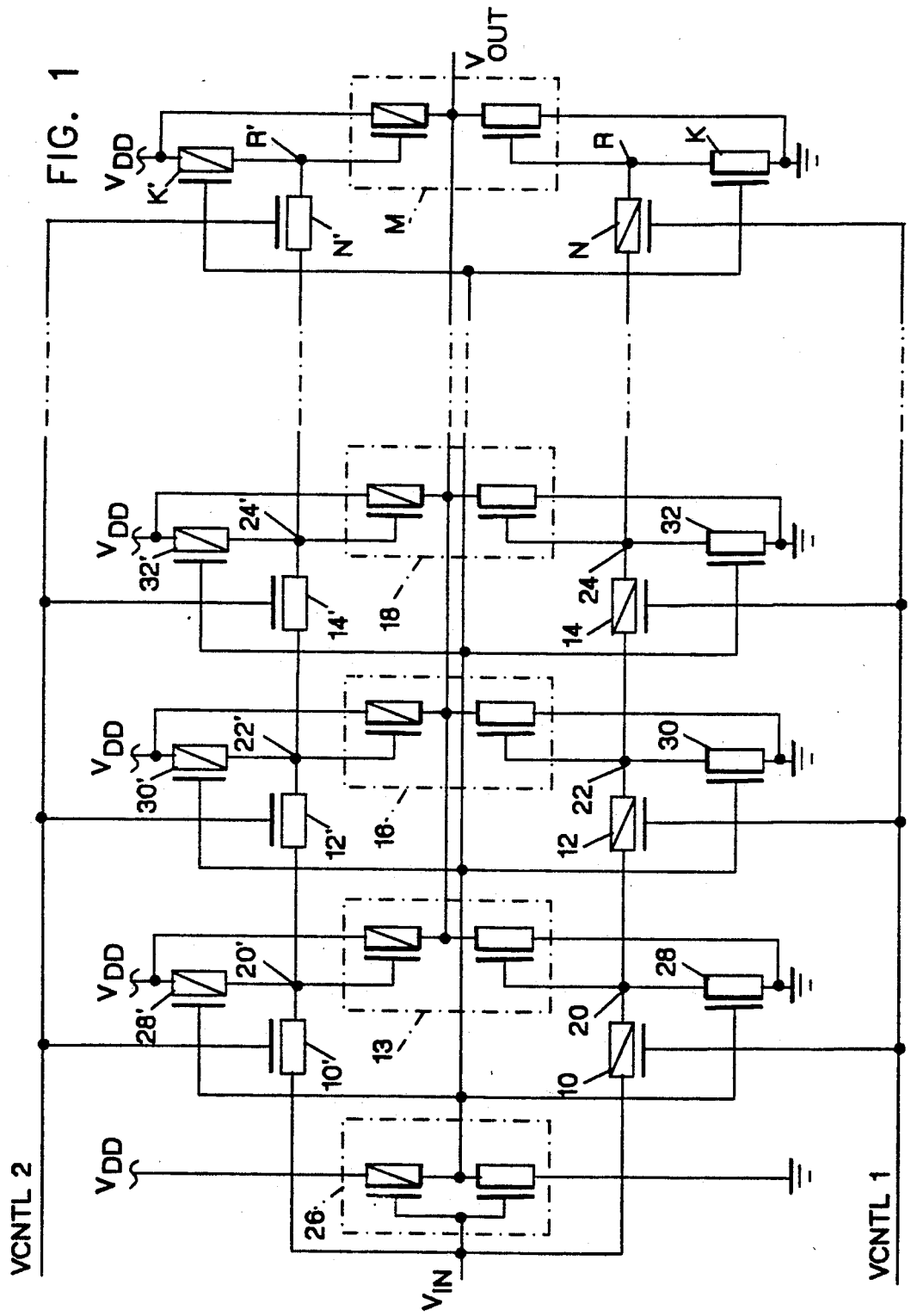
FIG. 1 shows a circuit diagram for the OCD circuit according to the teachings of the present invention.

FIG. 1 shows a circuit schematic of the integrated circuit arrangement according to the teachings of the present invention. The circuit arrangement includes an output circuit means (to be described hereinafter) which receives an input signal (not shown) at terminal Vin and output a sinusoidal waveform signal (not shown) at Vout. A controller means (to be described hereinafter) connected between the input node and the output node coact with the output circuit means so that components (to be described hereinafter) of the output circuit means do not conduct simultaneously.

Still referring to FIG. 1, the output circuit includes a plurality of transfer gates 10 and 10', 12 and 12', 14 and 14' through N and N' and a plurality of inverter stages 13, 16, 18 through M. The transfer gates are fabricated from N channel devices 10', 12', 14' etc., and P channel devices 10, 12, 14, etc. The transfer gates are connected in series and the output from a preceding stage such as 10 drives the input to a following stage such as 12. Similarly, stage 12 drives the input to a following stage such as 14 and so forth. Likewise, transfer gate 10' drives 12' and so forth. Also, as will be explained subsequently, the number of gates and inverter stages which are used depend on the shape of the sinusoidal waveform that a user intends to generate. All of the PFET devices are shown as a rectangle with a diagonal whereas the NFET devices are shown as a rectangle without any diagonal. The gate electrode of the PFET devices is connected to a control line labeled $V_{cnt/1}$ while the gate electrodes of the N-channel FET device are connected to a control line labeled $V_{cnt/2}$. The controller which generates the control lines $V_{cnt/1}$ and $V_{cnt/2}$ will be described subsequently.

In addition to the plurality of transfer gates, the output circuit arrangement includes a plurality of series connected inverters 13, 16, 18 through M. The number of inverter stages depends on the wave shape that one wishes to generate. However, the number of inverter stages and the number of transfer gates are identical. The inverter stages are identical and only one of the plurality of stages will be described, it being understood that the other stages are connected in a similar manner and function similarly to the described inverter stage. Each inverter stage is formed from a PFET device and a NFET device. The drain electrodes of the devices are connected to a common node Vout. The source of the P-channel FET devices are tied to a voltage level $V_{DD}$ which could be the positive voltage rail of a power supply. The source electrodes of the N-channel devices are tied to a second voltage source $V_{GD}$ which could be the ground rail of the power supply. The gate electrodes of each inverter pair are tied to nodes 20 and 20', 22 and 22', 24 and 24' through R and R'. As can be seen from the configuration, the output from each gate drives a device of the inverter stage. Therefore, the transfer gate sequentially switch its related inverter stage to generate a sinusoidal output signal at Vout.

It is generally agreed that the optimum waveform for transmission of baseband data is the raised cosine. The raised cosine minimizes the bandwidth required for a given data rate while preserving data integrity. The raised cosine waveform also radiates less than other types of waveforms for the same peak to peak voltage excursion. The described circuit generates a close approximation to the raised cosine waveform. This is accomplished by sequentially turning on each inverter pairs whose width to length (W/L) ratios are weighed in a cosine fashion. The inverter stages are sequenced by the delay achieved by the series connected transfer gates. The transfer gates are scaled in size to provide an equal time constant for each inverter stage. The time constant is generated by the transfer gate resistance and the gate capacitance of each inverter stage.

In one embodiment of the present invention, the W/L ratio of the PFET devices in the inverter stages are: 20/4, 58/4, 90/4, 114/4, 126/4, 126/4, 114/4, 90/4, 58/4 and 20/4. Likewise, the W/L ratio for the NFET device of the inverter stages are: 10/4, 28/4, 46/4, 58/4, 64/4, 64/4, 58/4, 46/4, 28/4 and 10/4. All measurements are in microns. It should be noted that by varying the width to length ratio of the inverter pairs any shape sinusoidal waveform can be generated. Appropriate values for the width to length ratio of the P-channel FET devices of the transfer gates are 60/4, 26/4, 20/4, 20/4, 18/4, 18/4, 20/4, 20/4, 26/4 and 60/4. Similarly, appropriate W/L ratios for the transfer gate NFETs are 32/4, 10/4, 9/4, 9/4, 9/4, 9/4, 9/4, 9/4, 10/4 and 32/4. All units for the above sizes are in microns. This example gives values for a ten stage raised cosine signal generator. However, it should be noted that this example should not be construed as a limitation on the scope of the present invention since it is within the skill of the art to change the weighed average of the devices and the number of stages without deviating from the scope or spirit of the present invention. The teaching to be remembered is that a sinusoidal signal waveform, including a raised cosine waveform, is generated by weighing the (W/L) ratio of an arbitrary number of transfer gates and inverter stages.

It should also be noted that other wave shapes other than the raised cosine can be generated by merely varying the weighing of the W/L of an arbitrary number of inverter stages. Also, a variable rise time and fall time can be generated by varying the control voltage of the transfer gate devices.

A DC voltage normally at $V_{DD}$ and ground setting to another value allows variation in TR/TF (rise time/fall time).

Still referring to FIG. 1, the above-described sinusoidal generator includes a controller which insures that the P and N-channel devices in each of the inverter pairs do not conduct simultaneously. In other words, the controller provides a signal for driving the inverter stages so that when the P-channel device is on, the N-channel device is off and vise versa. The controller includes a plurality of switching devices 28 and 28', 30 and 30', 32 and 32' through K and K', inverter 26 and the transfer gates. The switches are identical and are connected in series between $V_{DD}$ and ground. Each switch pair includes a P-channel FET device and an N-channel FET device. The gate electrodes of each switch pair are connected together. The source electrodes of the P-channel device in each switch pair are connected to Vdd. Vdd may be the positive rail of the power supply. The source electrodes of each of the N-channel devices of a switch pair are connected to the ground rail of the power supply.

By providing the control switch pairs, driving signal generating inverter pairs 13, 16, 18 through M, the devices in each of the signal generating inverter pairs are turned off more rapidly than they are turned on. This inhibits simultaneous conduction of the P and N-channel device in each of the signal generating inverter pairs. The resistance associated with the transfer gates along with the gate capacitance of the respective signal generating inverter pairs (such as 13, etc.) slow the turn-on of each device in the signal generating inverters while the direct input signals control the inverter pair 26 to turn the associated signal generating inverter pair (such as 13) off rapidly. It should be noted that the voltage which is applied to the transfer gates can be adjusted to vary the drain to source resistance and thus the output device turn-on time. The transfer gates width to length ratio can also be adjusted to aid in achieving the desired delay.

The circuit arrangement of FIG. 1 has been analyzed using ASTAP. ASTAP is a standard circuit simulation program. The circuit topology is inputted together with FET device models to analyze circuit performance.

FIGS. 2-5 show a comparison between the output from the circuit according to the teaching of the present invention and a typical off-chip CMOS driver circuit.

Figure 3:
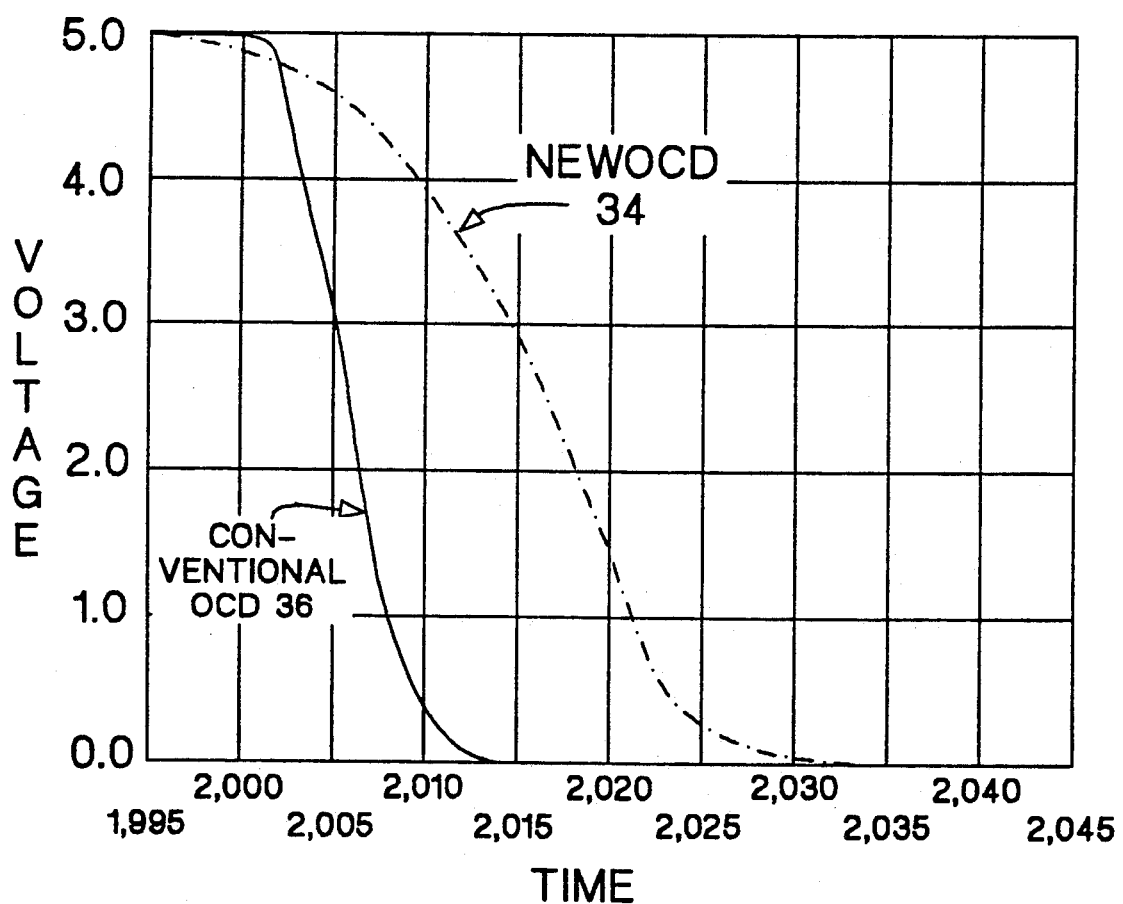
FIG. 3 is a graph simulating fall times for the OCD of FIG. 1 and a conventional OCD.
Figure 4:
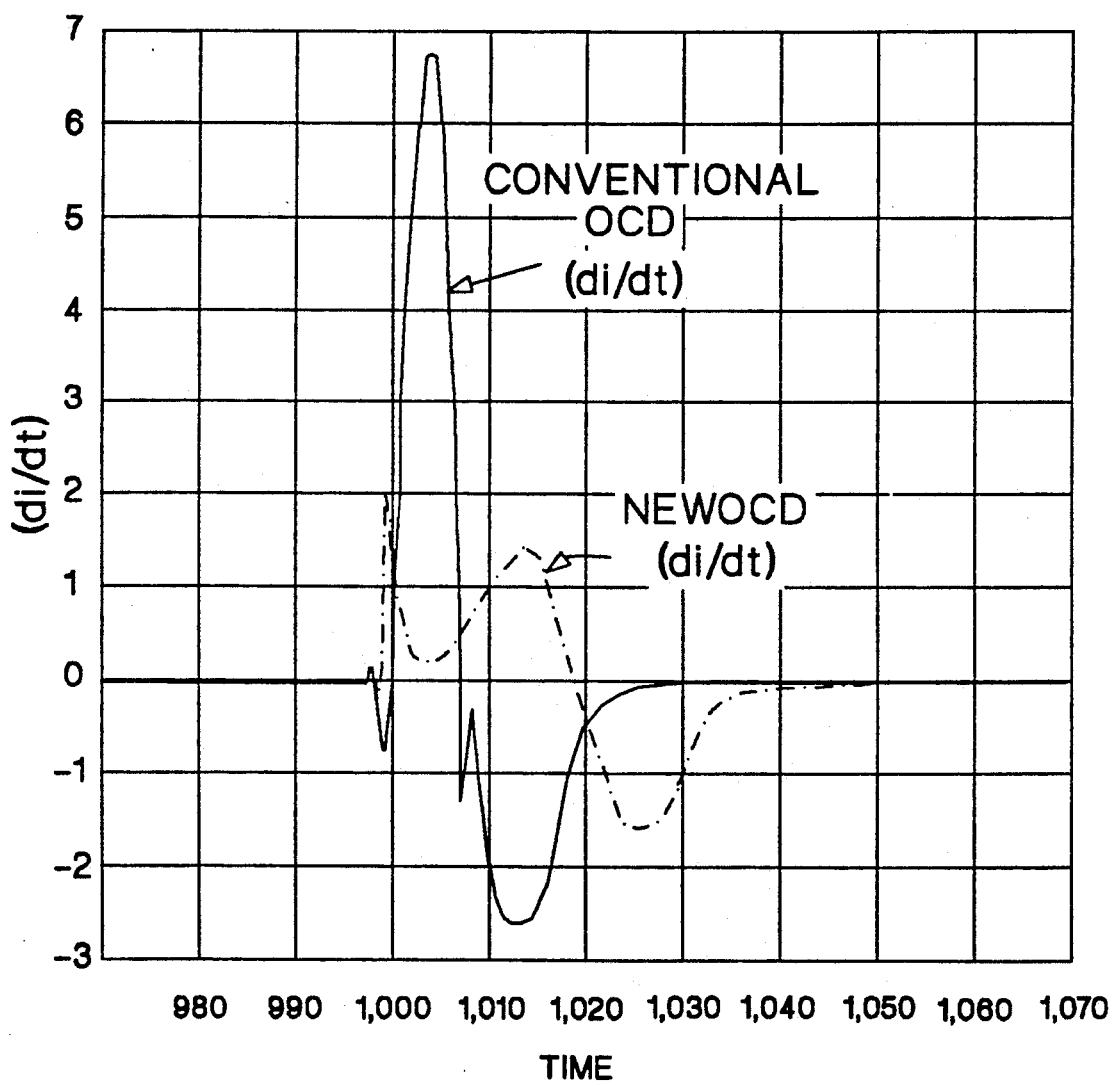
FIG. 4 is a graph which simulates di/dt at rise time for the OCD of FIG. 1 and a conventional OCD.
Figure 5:
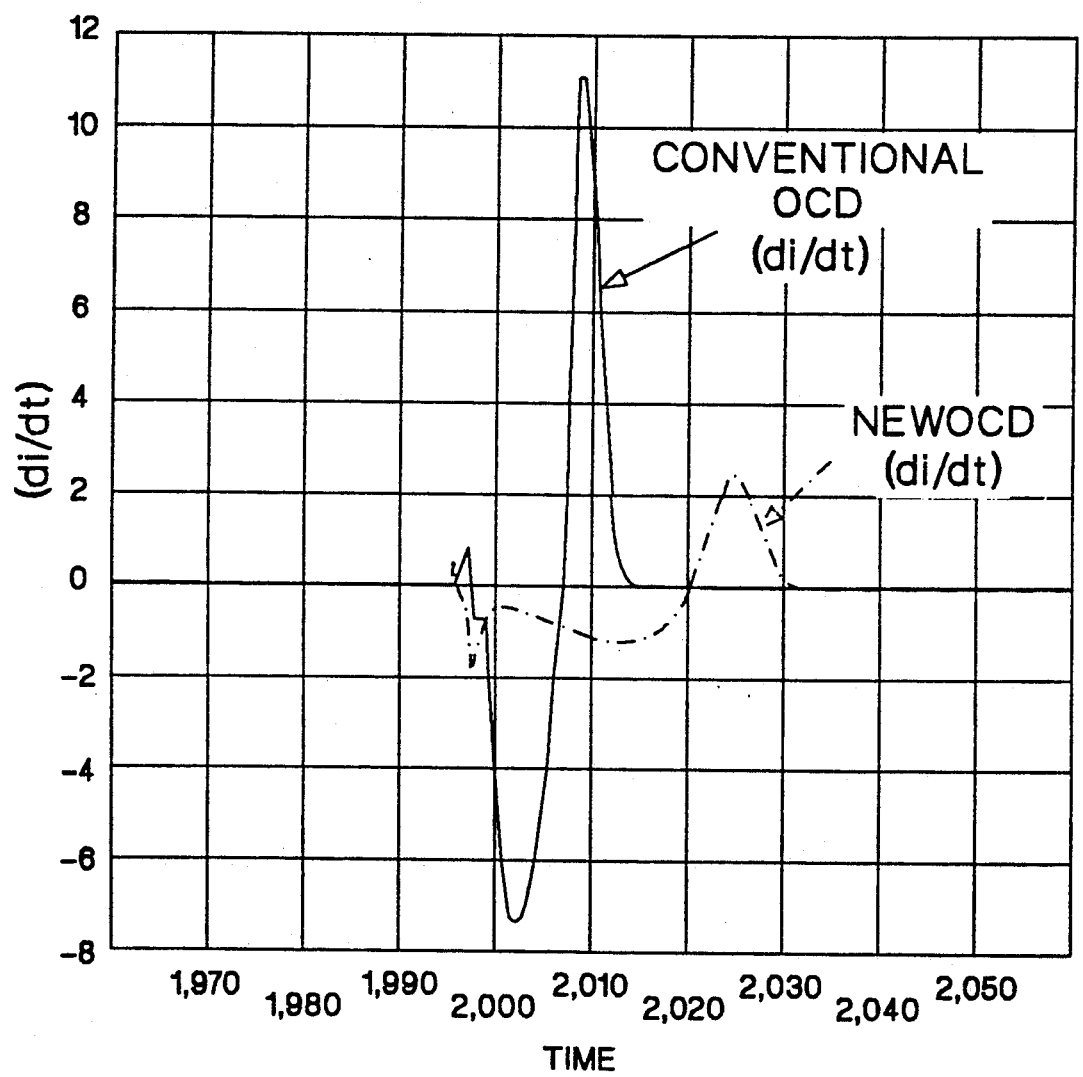
FIG. 5 is a graph which simulates di/dt during fall time for the OCD of FIG. 1 and a conventional OCD.

FIGS. 3-5 show a comparison between a signal waveform generated by a circuit arrangement according to the teachings of the present invention and a typical off-chip CMOS driver circuit. For each of the graphs, the net load which is attached to Vout is approximately 50 pf. Of course, other types an amount of loading could be used without deviating from the teachings of the present invention. Also, in each of the graph time (in nanoseconds) is plotted on the horizontal axis.

Figure 2:
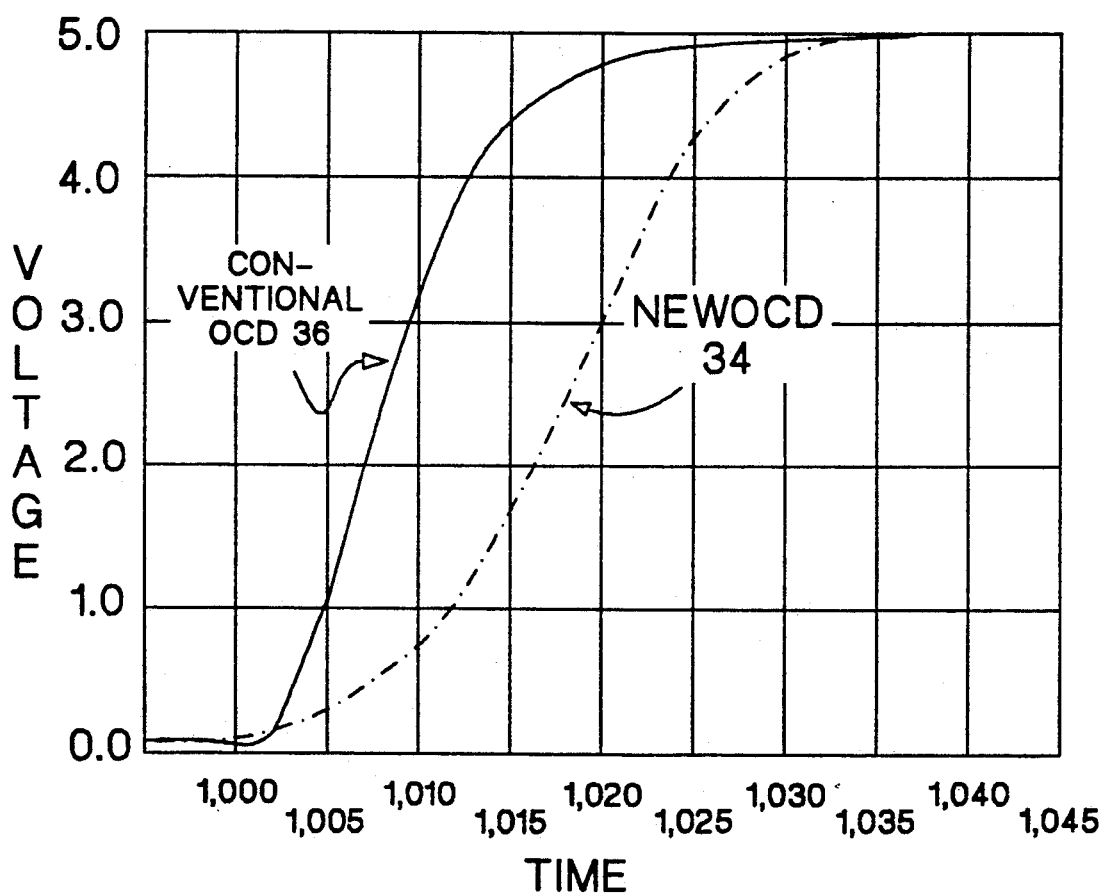
FIG. 2 is a graph which simulates the rise times for the OCD of FIG. 1 and a conventional OCD.

Turning to FIG. 2, voltage is plotted on the vertical axis. The graph shows the rise time for the off-chip driver of FIG. 1 and a conventional off-chip driver. The curve identified by numeral 34 (new OCD) is generated by the driver according to the teaching of the present invention while the curve 36 is generated by the conventional CMOS driver circuit. The measured rise time $(T_r)$ for curve 34 is 7.1 nanoseconds. The delay time $(t_d)$ for curve 34 is 19.2 nanoseconds. Similarly, the rise time for curve 36 is 4.7 nanoseconds and the delay time is 9.2 nanoseconds.

In order to comprehend the improvement the present circuit has provided, one has to examine the following current equation: $i = C\, dv/dt$ where i represents the current at the output node Vout, FIG. 1, to ground. C represents the capacitive load at the output node. dv/dt represents the rate at which the voltage is changing at Vout. With reference to the curves of FIG. 2, $T_d$ and $T_r$, it can be easily shown that the rate at which the voltage is changing in curve 34 is much less than the rate at which the voltage is changing (dv/dt) in a conventional CMOS driver shown by curve 36. Therefore, the ground current current i which flows in the new circuit is much less than that which flows in the conventional CMOS driver. The smaller the amount of ground current, the less is ground bounce and associated radiation problems. The curve 34 (FIGS. 2 and 3) has a raised cosine shape and confirms also that the proper weighing of the signal generating inverters provide a raised cosine waveform.

FIG. 3 is a plot showing the fall time between the circuit arrangement according to the teachings of the present invention and a conventional CMOS circuit arrangement. The curve that the circuit arrangement of FIG. 1 generates is marked with numeral 34 (new OCD) while the curve which the conventional CMOS driver generates is identified as 36. Using a similar analysis as was used with the rise time shown in FIG. 2, one concludes that the fall time of the new circuit is greater than that of the conventional driver. The conclusion is that the ground current generated by the present circuit is much less than that provided by conventional drivers and, as such, the ground bounce and other radiating problems which are associated with current CMOS drivers are significantly reduced by the teachings of the present invention. It should be noted that FIGS. 2 and 3 show one half cycle of the sinusoidal waveform (i.e., a raised cosine) which is generated by the teachings of the present invention.

FIG. 4 is a plot which shows the rate at which current is changing (di/dt) at the output of the circuit of FIG. 1 and that of a conventional CMOS off-chip driver. In FIG. 4, di/dt in milliamps per second is plotted on the vertical axis while time in nanoseconds is plotted on the horizontal axis. As discussed above, one of the problems which the present invention corrects is that of ground bounce. Ground bounce may be represented by the mathematical expression $V = L\, di/dt$ where V represents voltage, L is the inductance in the net that is attached to the node Vout (FIG. 1) and di/dt is the rate at which current changes. A careful examination of the expression shows that the faster the rate of change (i.e., a high di/dt) the greater will be the value of V and the related ground bounce. The preferred result is to make di/dt as small as possible and the ground bounce and related problems will be reduced to acceptable levels. With respect to the curve of FIG. 4, it should be noted that this is the di/dt which occurs during the rise time of the sinusoidal signal of FIG. 2. The curve which is labeled new OCD di/dt represents the curve (di/dt) generated by the circuit of the present invention. While the curve labeled conventional OCD di/dt is the (di/dt) curve generated by the conventional CMOS off-chip driver. Observation of the graph clearly shows that the di/dt which is generated by the circuit of FIG. 1 is much less than that generated by the conventional off-chip CMOS driver. As before, this shows that ground bounce and related radiation problems are significantly reduced by the circuit of the present invention.

FIG. 5 is a plot showing the di/dt associated with the falling edge of the output signal generated by the present invention and a conventional CMOS driver. In other words, the graph of FIG. 5 shows the di/dt associated with the falling edge of the signal in FIG. 3. By pursuing a similar signal analysis as that which was done relative to FIG. 4, it is evident that the rate of current change on the falling edge is much less for the CMOS driver of the present invention than that associated with the conventional CMOS driver. As with FIG. 4, di/dt is plotted on the vertical axis of FIG. 5 and time is plotted on the horizontal axis. Also, the curve which is associated with the circuit of the present invention is marked as NEW OCD (di/dt) while the curve which is associated with the conventional CMOS off-chip driver is labeled conventional OCD (di/dt).

The present invention provides an improved CMOS circuit which can drive off-chip nets or internal nets with significantly reduced ground bounce and associated radiation problems. The circuit controls the rise and fall times of the waveform and prevents the output devices from conducting simultaneously. The desirable characteristics of the present invention are still available even if the netload varies. Variations in capacitive loads were simulated with resulting changes in Rise Time (TR) and Fall Time (T Fall) but still preserving the cosine waveshape.

While there has been described what is considered to be the preferred embodiment of the invention, variations and modifications in this embodiment will occur to those skilled in the art once they are made aware of the basic concepts of the invention. Therefore, it is intended that the appended claims shall be construed to include both the preferred embodiment and all such variations and modifications as fall within the true spirit and scope of the invention.

What is claimed is:

1. A complementary MOS integrated circuit comprising:
    a first circuit means for generating a sinusoidal waveform signal, said first circuit means including a plurality of complementary pairs of FET devices coupled in cascade between an input node (Vin) and an an output node (Vout);
    delay means operatively coupled between the input node and the output node; said delay means receiving an input signal provided at the input node and sequentially delaying the input signal before it is applied to a selected FET device in each of the complementary pairs of FET devices; and
    a second circuit means operatively coupled between the input node and the output node; said second circuit means responsive to the input signal to generate therefrom control signals that simultaneously inhibit conduction of non-selected FET devices.

2. The complementary MOS integrated circuit of claim 1 wherein the sinusoidal waveform signal includes a raised cosine waveform signal.

3. The complementary MOS integrated circuit of claim 1 wherein the first circuit means further includes an output node (Vout) for receiving the sinusoidal waveform signal from said at least one inverter pair of series connected FET devices;
    an input node (Vin) for receiving the input signal;
    a plurality of series connected inverter pairs coupled to said at least one inverter pair of series connected FET devices; and
    delay means coupling the plurality of series connected inverter pairs and said at least one inverter pair of series connected devices to said input node.

4. The complementary MOS integrated circuit of claim 1 wherein the delay means includes
    a pull-up delay having a plurality of pull-up transfer gates connected in tandem, with each transfer gate having an electrode connected to one FET in each of the complementary pairs of FET devices, an input for receiving the input signal from a previous transfer gate and an output for providing a delayed input signal to the next transfer gate: and
    a pull-down delay having a plurality of pull-down transfer gates connected in tandem, with each transfer gate having an input for receiving the input signal from a previous transfer gate, an output for providing a delayed input signal to a next transfer gate and an electrode connected to another FET in each of the complementary pair of FET devices.

5. The complementary MOS integrated circuit of claim 4 wherein the plurality of pull-up transfer gates includes N-channel FET devices and the plurality of pull-down transfer gates includes P-channel FET devices.

6. The complementary MOS integrated circuit of claim 1 wherein the second circuit means includes a circuit arrangement with an input node and an output node; said circuit arrangement receiving the input signal which is inverted and forwarded to the output node; and
    switching means interconnecting the circuit arrangement to the plurality of complementary pairs of FET devices.

7. The complementary MOS integrated circuit of claim 6 wherein the switching means includes a plurality of P-channel devices connected in parallel to the output node of the circuit arrangement with each P-channel device interconnecting the output of the circuit arrangement to one device in each of the plurality of complementary pairs of FET devices and a plurality of N-channel devices connected in parallel to the output node of the circuit arrangement with each N-channel device interconnecting the output node of the circuit arrangement to another device in each of the plurality of complementary pairs of FET devices.

8. The complementary MOS integrated circuit of claim 6 wherein the circuit arrangement includes a P-channel FET device connected in series with an N-channel FET device.

9. A CMOS circuit arrangement for generating a sinusoidal waveform comprising:
    an input node (Vin) for receiving an input signal;
    an output node (Vout) for generating an output signal;
    a plurality of inverter circuit means coupled in tandem between the input node and the output node; and
    a plurality of transfer gates connected in tandem and coupled to the input node, with each transfer gate in the plurality of transfer gates operatively coupled to selected ones of the plurality of inverter circuit means; said each transfer gate delaying the input signal to the selected ones of the plurality of series connected inverter circuit means to cause said selected ones of the plurality of series connected inverter circuit means to switch sequentially to provide the sinusoidal waveform at the output node.

10. A CMOS circuit arrangement of claim 9 wherein each inverter circuit means includes a P-channel FET device connected in series to an N-channel FET device.

11. The CMOS circuit arrangement of claim 9 wherein a width-to-length (W/L) ratio of devices in each inverter circuit means is weighted to provide the sinusoidal waveform.

12. The CMOS circuit arrangement of claim 11 wherein the (W/L) ratio is weighed to provide a raised cosine waveform.

13. The CMOS circuit of claim 12 wherein each inverter circuit means includes a PFET device connected in series with an NFET device, with the W/L ratio of the PFET devices being 20/4, 58/4, 90/4 114/4, 126/4, 126/4, 114/4, 90/4, 58/4 and 20/4 and the W/L ratio of the NFET devices being 10/4, 28/4, 46/4, 58/4, 64/4, 64/4, 58/4, 46/4, 28/4 and 10/4.

14. The CMOS circuit arrangement of claim 10 further including a control means operatively coupling the plurality of inverter circuit means to the input node; said control means responsive to the input signal to cause the P-channel device and the N-channel device of each inverter pair to conduct sequentially.

15. (Amended) The CMOS circuit arrangement of claim 14 wherein the control means includes:
   an inverter circuit having an input connected to the input node and an output; and
   a plurality of PFET and NFET (28, 28', 30, 30'... K and K') pairs connected in parallel with the output with PFET devices in each of the PFET and NFET pairs operatively coupled to the P-channel device in each inverter pair and the NFET devices in each of the PFET and NFET pairs operatively coupled to the N-channel device in each inverter pair.

16. An improved CMOS integrated circuit comprising:
   a signal input terminal;
   a signal output terminal;
   an output circuit means for generating a sinusoidal waveform signal coupled between the signal output terminal and the signal input terminal, said output circuit means including a plurality of PFET and NFET inverter pairs connected in cascade;
   a plurality of transfer gates connected in tandem between the signal input terminal and signal output terminal with different ones of the transfer gates connected to PFET and NFET devices of each inverter pair; and
   a control means coupling an input signal at the signal input terminal to each one of the plurality of the PFET and NFET inverter pairs said control means responsive to signal at the data input terminal to inhibit conduction of PFET devices in the plurality of inverter pairs when one NFET device is conducting and to inhibit conduction of NFET devices in the plurality of inverter pairs when one PFET device is conducting.

17. The improved CMOS integrated circuit of claim 15 wherein simultaneous conduction of devices in the inverter pairs is inhibited by turning off the PFET and NFET in each inverter pairs more rapidly than they are turned on.

18. The improved CMOS integrated circuit of claim 16 wherein the control means includes a first inverter circuit coupled to the signal input node; and
   a plurality of switching devices coupled to the inverter circuit, with each one of the switching devices operatively coupled to a selected one of the PFET and NFET inverter pairs.

* * * * *